（12）United States Patent
Anderson et al.

(10) Patent No.: US 6,413,459 B1
(45) Date of Patent: Jul. 2, 2002

(54) METHOD FOR HANDLING AND PROCESSING MICROELECTRONIC-DEVICE SUBSTRATE ASSEMBLIES

(75) Inventors: Sheldon Anderson, Meridian; Tony Ibarra, Nampa, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/130,199

(22) Filed: Aug. 5, 1998

(51) Int. Cl.[7] .................. B29C 61/02; B29C 61/06; B65G 49/07
(52) U.S. Cl. ............... 264/230; 264/342 R; 414/941
(58) Field of Search ............................. 414/935, 936, 414/937, 938, 939, 940, 941; 264/230, 275, 342 R

(56) References Cited

U.S. PATENT DOCUMENTS

| | | | | |
|---|---|---|---|---|
| 3,874,525 A | * | 4/1975 | Hassan et al. | 118/49 |
| 3,968,885 A | * | 7/1976 | Hassan et al. | 118/49 |
| 4,875,824 A | * | 10/1989 | Moe et al. | 414/751 |
| 5,382,127 A | * | 1/1995 | Garric et al. | 414/217 |
| 5,501,568 A | * | 3/1996 | Ono | 414/936 |
| 5,711,647 A | * | 1/1998 | Slocum | 414/937 |
| 5,824,185 A | | 10/1998 | Nakamura et al. | |
| 5,851,296 A | | 12/1998 | Haraguchi et al. | |

\* cited by examiner

*Primary Examiner*—Angela Ortiz
(74) *Attorney, Agent, or Firm*—Perkins Coie LLP

(57) ABSTRACT

Methods for selectively moving a microelectronic-device substrate assembly in a processing machine having a first side, a second side opposite the first side, and a processing path extending from the first side to the second side. The processing machine can also include a cassette proximate to a second side of the processing station that moves to position a substrate at the processing path. In one aspect of the invention, the substrate handling apparatus includes a guide member attached to the processing machine, an arm slidably attached to the guide member, and a clamp attached to the arm. The guide member is generally fixedly attached to the processing machine, and the guide member generally has a shape corresponding to the processing path. The arm can include a first section moveably attached to the guide member to translate along the guide member, and a second section projecting from the first section to position at least a portion of the second section at least proximate to the processing path. The clamp is coupled to the second section of the arm in alignment with the processing path. A motor is coupled to the arm via a drive member to move the arm along the guide member between a first position in which the clamp is near the first side of the plate assembly and a second position in which the clamp is near the cassette at the second side of the plate assembly.

8 Claims, 8 Drawing Sheets

METHOD FOR HANDLING AND PROCESSING MICROELECTRONIC-DEVICE SUBSTRATE ASSEMBLIES

TECHNICAL FIELD

The present invention relates to methods for handling and processing microelectronic-device substrate assemblies, such as semiconductor wafers, field emission displays and other types of substrates with one or more microelectronic-devices. More particularly, the present invention relates to handling and processing substrate assemblies when the substrate assemblies are attached to a backing film stretched over a frame.

BACKGROUND OF THE INVENTION

Microelectronic-device substrate assemblies are typically semiconductor substrates used in the manufacturing of semiconductor devices, field emission displays and other microelectronic devices. In a typical application for manufacturing semiconductor devices, the substrate assemblies are semiconductor wafers upon which a plurality of individual devices are formed in several processing steps. Memory devices, for example, are fabricated on 6–12 inch wafers that provide enough surface area to fabricate several hundred individual memory devices on a single substrate assembly. After the circuits of the individual devices have been constructed, the substrate assembly is cut to separate the devices from one another, and then the individual devices are often packaged for mounting to a printed circuit board assembly.

One aspect of manufacturing or using substrate assemblies is handling the substrate assemblies in processing machines. Substrate assemblies are fairly delicate structures that may chip or crack, and the integrated circuits of the individual devices are very delicate structures that may be damaged or destroyed by static electricity. To protect the substrate assemblies during certain stages of processing, the substrate assemblies are attached to a backing film that is stretched over a metal frame to avoid directly contacting the substrate assemblies with the handling equipment. In a typical fabrication process, for example, substrate assemblies are coupled to frames by the backing film for processing in a dicing machine that cuts the substrate assemblies to separate the devices from one another. Additionally, because the backing film may stretch and cause difficulties in cutting the substrate assemblies in the dicing machines, the frames and the substrate assemblies are placed in an "expander" machine that shrinks the backing film until it is taut. Existing expander machines, however, have many drawbacks that make it difficult to handle substrate assemblies.

FIG. 1 is an isometric view partially illustrating an existing expander machine 10 that has a processing station 20, a loader 30 and a cassette 50. The processing station 20 has a plate assembly with a first plate 22 and a second plate 24 spaced apart from one another by a gap 26. A number of posts 27 attached to the table 12 support the first and second plates 22 and 24 to position the plate gap 26 at a desired elevation with respect to the cassette 50. The processing station 20 has a first side 28 facing the loader 30 and a second side 29 facing the cassette 50.

The loader 30 is mounted to a base 31 proximate to the first side 28 of the processing station 20. The loader 30 has a housing 32, a motor 33 attached to the housing 32, and a spring-loaded tape assembly 34 with a thin metal tape 36 that projects from the housing 32. The tape 36 includes a plurality of holes 38 arranged in a line along the length of the tape 36 to receive the teeth of a sprocket 39 attached to an output shaft of the motor 33. A clamp 40 is attached to the end of the tape 36. The clamp 40 has a pair of clips 42, and each clip 42 has an upper finger and a lower finger that are biased toward one another.

In operation, the motor 33 turns the sprocket 39 to move the tape 36 and the clamp 40 along a processing path P through the gap 26 between the first and second plates 22 and 24. For example, to remove a selected substrate assembly from the cassette 50, the motor 33 drives the tape 36 out of the tape assembly 34 until the clamp 40 engages a frame 52 to which the selected substrate assembly is attached via a backing film. The motor 33 then reverses the rotation of the sprocket 39 to pull the frame 52 and selected substrate assembly out of the wafer cassette 50 and into the plate gap 26 between the first and second plates 22 and 24 at the processing station 20. The spring-loaded tape assembly 34 accordingly recoils a portion of the tape 36 in a manner similar to a tape measure. After the substrate assembly has been processed at the processing station 20, the motor 33 rotates the sprocket 39 to drive the tape 36 from the tape assembly 34 until the frame 52 and selected substrate assembly are replaced in the wafer cassette 50. The motor 33 then reverses the rotation of the sprocket 39 very quickly to disengage the clips 42 from the frame 52 and retract the clamp 40 to the loader 30.

One drawback with the expander machine 10 is that the loader 30 may not accurately drive the tape 36 and the clamp 40 along the processing path P to accurately pick up, position and release the frames 52 for processing the substrate assemblies. More particularly, the thin metal tape 36 often cracks in a line between the holes 38. The teeth of the sprocket 39 may accordingly pass through the cracks between the holes 38 in the thin metal tape instead of pushing against the portion of the tape 36 between the holes 38. The cracks in the tape 36 between the holes 38 typically develop to a point at which the loader 30 is inoperable and the tape assembly 34 must be replaced. Repairing the loader 30, however, results in down-time for the expander machine 10. Thus, the durability of the tape assembly 34 is a significant drawback in handling microelectronic-device substrate assemblies in the expander machine 10.

Another problem of the expander machine 10 is that the clamp 40 may hit one of the first and second plates 22 and 24 of the processing station 20 as the loader 30 drives the tape 36 from the loader 30 to the cassette 50. This problem arises because the clamp 40 causes the thin tape 36 to bend downward as the clamp 40 moves from the loader 30 toward the processing station 20. The vertical displacement of the clamp 40 accordingly increases with increasing distance from the loader 30 such that the height of the loader 30 is generally adjusted at the initial set-up so that the clamp 40 passes through the plate gap 26 on both the first and second sides 28 and 29 of the processing station 20. Moreover, as the thin tape 36 wears and cracks develop between the holes 38, the bend radius of the tape 36 changes over time causing the vertical displacement of the clamp 40 along the processing path to also change. The clamp 40 may even hit one of the first or second plates 22 or 24 when the tape 36 wears down after a period of use. When this occurs, the height of the loader 30 must be readjusted to compensate for the changes in the integrity of the tape 36. Adjusting the height of the loader 30 so that the clamp 40 passes through the gap 26 of the processing station 20 is a difficult and time-consuming process because it is generally a trial-and-error procedure. Therefore, constantly adjusting and readjusting the loader 30 so that the clamp 40 can "shoot the gap" of the plate gap 26 also causes down-time for the expander machine 10.

Still another drawback of the expander machine 10 is that the clamp 40 may not positively engage or disengage the frames 52. The frames 52 wear down the interior surfaces of the clips 42 causing a gap to form between the fingers of each clip 42. After the frames 52 wear down the interior surfaces of the clips 42, the clamp 40 may not sufficiently engage a frame 52 to pull the frame 52 out of the cassette 50. Therefore, the durability of the clamp 40 also presents another operating concern of using the expander machine 10.

SUMMARY OF THE INVENTION

The present invention is directed towards methods for selectively moving a microelectronic-device substrate assembly in a processing machine, and methods of operating such processing machines. A typical processing machine includes a processing station having a first side, a second side opposite the first side, and a processing path extending from the first side to the second side. The processing machine can also include a moveable cassette proximate to a second side of the processing station that moves to position a selected substrate assembly at the processing path.

In one aspect of the invention, a substrate handling apparatus includes a guide member attached to the processing machine, an arm slidably attached to the guide member, and a clamp attached to the arm. The guide member is generally fixedly attached to the processing machine, or it is otherwise fixed with respect to the processing path. The guide member also generally has a shape extending along the processing machine at least substantially parallel to the processing path. The guide member, for example, can be an elevated beam above the table, a rail on the table, a channel in the table, a threaded ball-screw, or other structures that can guide the arm along the processing path.

The arm of the guide assembly can include a first section moveably attached to the guide member to translate along the guide member, and a second section projecting from the first section. The first and second arm sections are configured to position at least a portion of the second section at least proximate to the processing path. For example, the first arm section can be a bracket attached to the guide member and the second arm section can be a bar projecting from the bracket transverse to the processing path to position a portion of the bar over the processing path. The clamp is coupled to the second section of the arm at the clamp location in alignment with the processing path. The clamp generally has a pair of jaws to releasably grip a selected frame supporting a selected substrate assembly.

The substrate handling apparatus also includes a drive mechanism having a motor and a drive member. The drive member is coupled to both the motor and the arm to transfer an output from the motor to the arm. The motor can be a servo motor, and the drive member can be one or more belts coupled to sprockets or pulleys to transfer the rotational output of the motor to a linear action along the guide member.

In a particular aspect of the invention, the motor and the drive member selectively move the arm along the guide member between a first position in which the clamp is near the first side of the plate assembly and a second position in which the clamp is near the cassette at the second side of the plate assembly. The drive mechanism accordingly moves the clamp at an elevation along the processing path through the processing station such that the clamp holds a selected substrate assembly at the processing station in the first position, or the clamp grips or releases the selected frame and substrate assembly at the cassette in the second position. For example, the clamp can have an actuator coupled to a jaw assembly with first and second jaws. When the clamp is in the second position, the actuator closes the jaws to grip the selected frame. The drive mechanism then moves the arm along the guide member to carry the substrate assembly from the second position to the first position at the processing station. After the substrate assembly has been processed, the drive mechanism moves the arm back along the guide member until the clamp is in the second position. The actuator then opens the clamp jaws to release the selected frame and place the selected frame and substrate assembly back in the cassette.

DETAILED DESCRIPTION OF THE INVENTION

The present invention is directed toward methods for manufacturing and handling of microelectronic-device substrate assemblies. Many specific details of certain embodiments of the invention are set forth in the following description, and in FIGS. 2–8, to provide a thorough understanding of these particular embodiments. One skilled in the art, however, will understand that the invention may have additional embodiments, or that the invention may be practiced without several of the details described in the following description.

Figure 2:
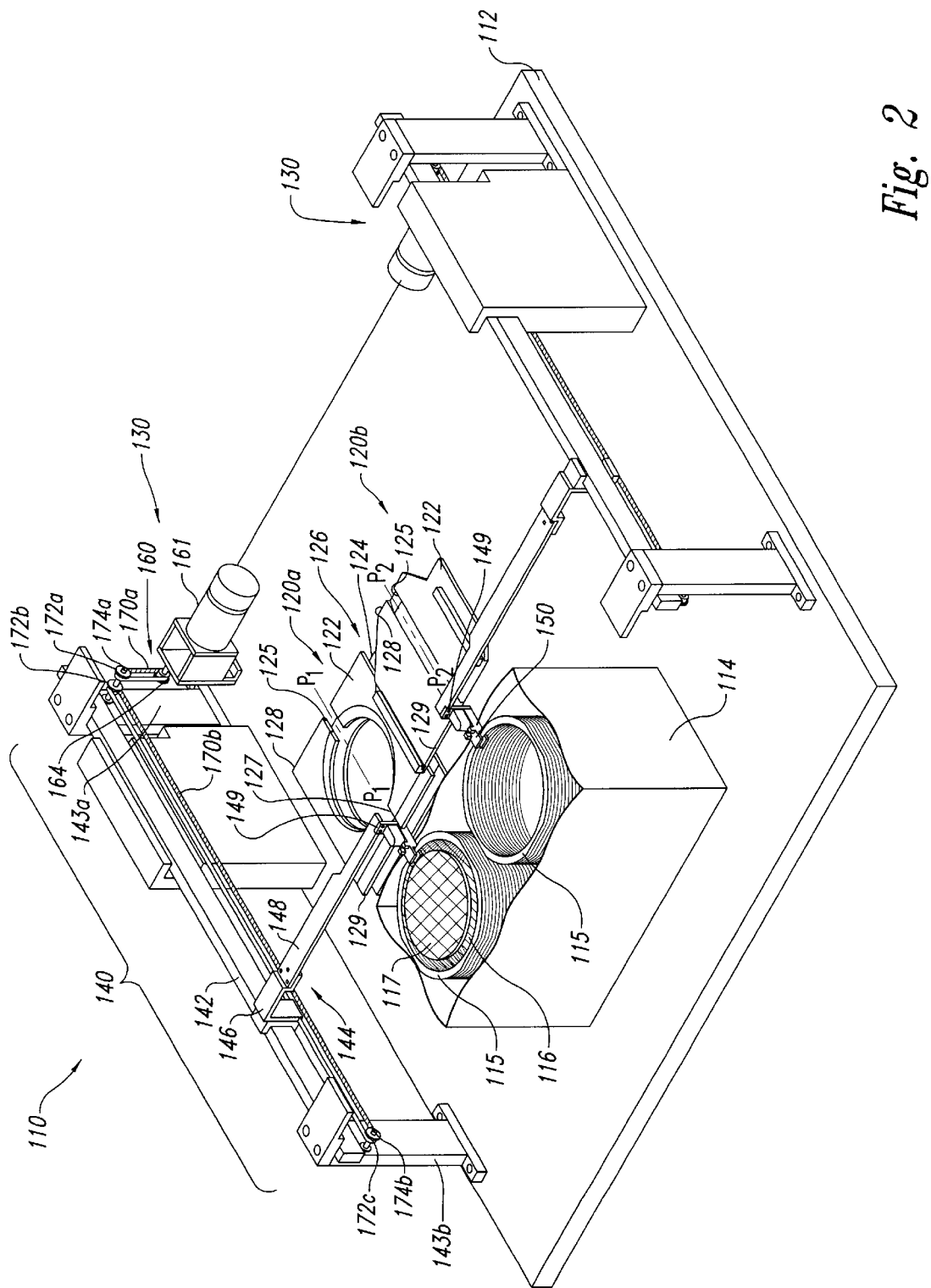
FIG. 2 is an isometric view of an expander machine with a handling assembly used in a method in accordance with one embodiment of the invention.

FIG. 2 is an isometric view of an expander machine 110 with two wafer handling apparatuses 130 in accordance with one embodiment of the invention. The expander machine 110 has a cassette 114 attached to a table 112, first and a second processing stations 120a and 120b (collectively referred to in the text by reference number 120) positioned at one side of the cassette 114, and one substrate handling apparatus 130 for each of the processing stations 120. The processing stations 120 are generally similar to one another, and the substrate handling apparatus 130 at the processing stations are also similar to one another. Thus, for the purpose of brevity, the first processing station 120a and the substrate handling apparatus 130 at the first processing station 120a are described herein with the understanding that like reference numbers refer to like parts in the second processing station 120b.

The cassette 114 holds a plurality of frames 115 and microelectronic-device substrate assemblies 117 (only one assembly shown). In a typical application, a thin backing film 116 is attached to each frame 115, and a microelectronic-device substrate assembly 117 is attached to the backing film 116. The substrate assemblies 117 are generally coupled to the frames 115 via the backing film 116 to provide a rigid frame to handle the substrate assemblies 117 without directly contacting the substrate assemblies 117 with the handling equipment.

The first processing station 120a has first and second plates 122 and 124 spaced apart from one another by a plate gap 126. Additionally, the first plate 122 generally has a first slot 125 at a first side 128 of the processing station 120a, and a second slot 127 at a second side 129 of the processing station 120a. The first and second slots 125 and 127 are aligned with a processing path $P_1$ extending through the first processing station 120a to the cassette 114. The second plate 124 is generally mounted to the table 112 by a number of posts (not shown), and the first plate 122 is spaced apart from the second plate 124 by a number of spacers (not shown). The gap 126 between the first and second plates 122 and 124 is accordingly positioned at a selected elevation with respect to the cassette 114.

The second processing station 120b has only a first plate 122 attached to the frame 112 by a number of posts (not shown). A single slot 125 extends along the first plate 122 of the second processing station 120b from a first side 128 to a second side 129. The slot 125 defines a processing path $P_2$ of the second processing station 120b. In light of the structure of the processing stations 120 and the cassette 114, an embodiment of a substrate handling apparatus 130 will now be described.

Figure 3:
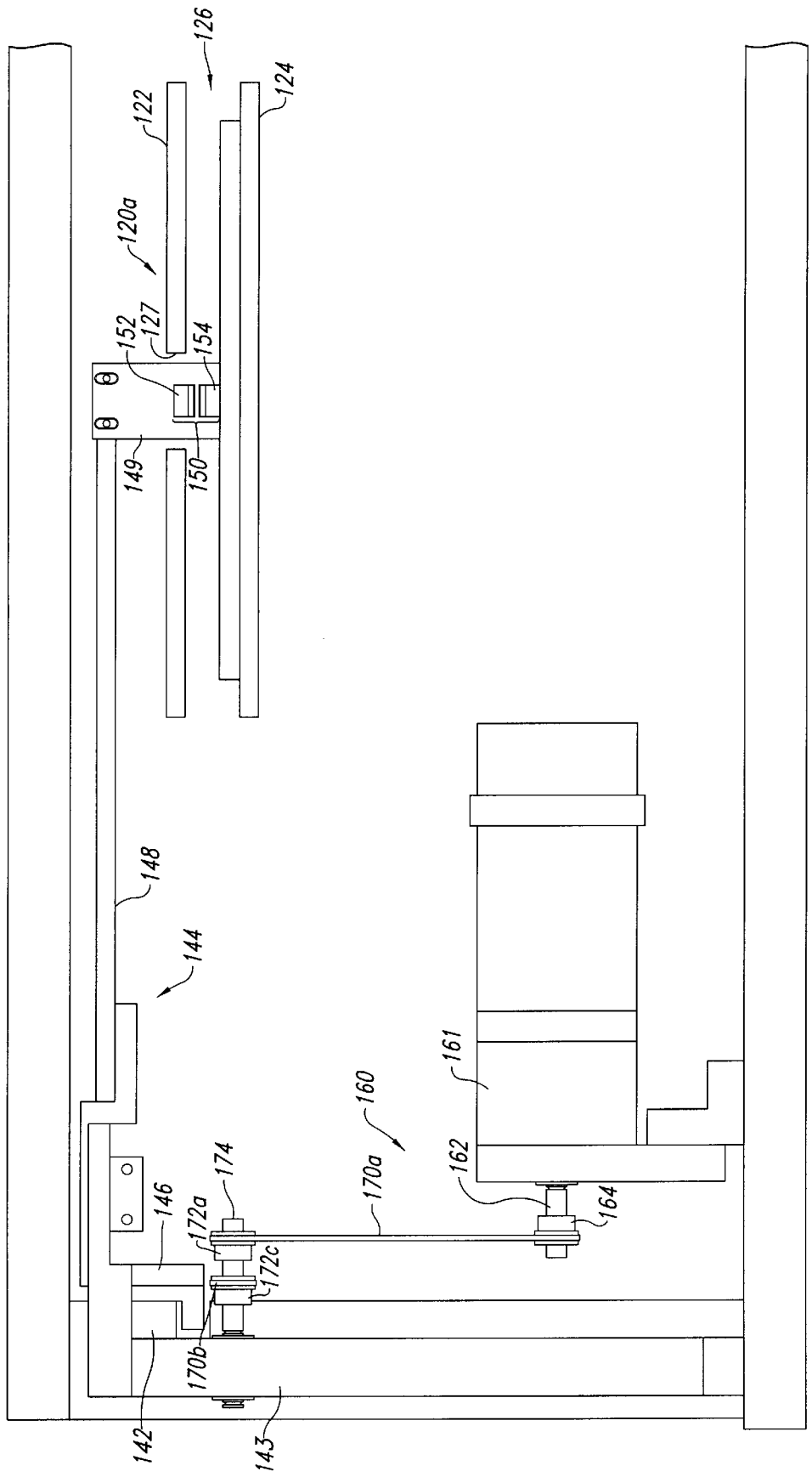
FIG. 3 is a front elevational view partially illustrating the expander machine and the handling assembly of FIG. 2.

FIG. 3 is a front elevational view of the substrate handling apparatus 130 at the first processing station 120a of the expander machine 110. Referring to FIGS. 2 and 3 together, the substrate handling apparatus 130 has a guide assembly 140 (FIG. 2) to hold a clamp 150 at a fixed elevation with respect to the first and second plates 122 and 124 along the processing path $P_1$, and a drive mechanism 160 to operate the guide assembly 140. As described below, the guide assembly 140 and the drive mechanism 160 shown in FIGS. 2 and 3 provide a durable device that consistently moves the clamp 150 along the processing path $P_1$.

The embodiment of the guide assembly 140 shown in FIGS. 2 and 3 has a fixed guide member 142 attached to the table 112 and an arm 144 movably attached to the fixed guide member 142. The fixed guide member 142 extends in a direction corresponding to the processing path $P_1$. The fixed guide member 142, more particularly, generally extends at least substantially parallel to the processing path $P_1$ at the side of the processing path $P_1$. In an alternative embodiment (not shown), the fixed guide member 142 can be superimposed above or below the processing path $P_1$. In the embodiment illustrated in FIGS. 2 and 3, the fixed guide member 142 is an elevated beam attached to legs 143a and 143b that are mounted to the processing machine 110 proximate to the edge of the table 112.

The arm 144 of the guide assembly 140 translates along the guide member 142 to move at least a portion of the arm along the processing path $P_1$. In the embodiment shown in FIGS. 2 and 3, the arm 144 includes a first arm section 146 slidably attached to the guide member 142 and a second arm section 148 attached to the first section 146. The first arm section 146, for example, can be a bracket that slides along the guide member 142, or the first arm section 146 may have a plurality of rollers that roll along the guide member 142. The second section can have a first end attached to the first section 146 and a second end projecting from the first section 146 to a location either on or superimposed with the processing path $P_1$. The second arm section 148, for example, can be a bar projecting from the first arm section 146 transverse to the processing path $P_1$ to position a portion of the second arm section 148 over the processing path $P_1$. The arm 144 can also have an adjustable clamp holder 149 attached to the second end of the second arm section 148 to move vertically with respect to the second arm section 148 for positioning the clamp 150 at the processing path $P_1$.

The arm 144 is generally made from a lightweight and rigid material, such as aluminum or suitable plastics. Additionally, the second arm section 148 has a sufficient thickness and shape to extend over the processing station 120a without bending to support the clamp 150 at a constant elevation with respect to the processing station 120a. As shown in FIGS. 2 and 3, the arm 144 can be positioned above the first plate 122 of the processing station 120a, and the clamp holder 149 can project downwardly from the arm 144 through the slots 125 and 127 in the first plate 122 to position the clamp 150 in the plate gap 126. In another embodiment (not shown), the second arm section 148 can be configured to move through the plate gap 126 between the first and second plates 122 and 124, and the clamp 150 can be attached directly to the second end of the second arm section 148 without the clamp holder 149. In the embodiment in which the second arm section 148 passes through the plate gap 126, the first plate 122 does not necessarily have slots 125 and 127 because the clamp holder 149 is not attached to the second arm section 148.

The drive mechanism 160 has a motor 161 attached to the table 112 and a drive member 170 (indicated by reference numbers 170a and 170b in FIGS. 2 and 3). The drive member 170 is coupled to the motor 161 and to the first arm section 146 such that the motor 161 and the drive member 170 selectably move the first arm section 146 along the guide member 142 to position the clamp 150 at desired locations along the processing path $P_1$. The motor 161 is generally a servo motor with a drive shaft 162 and a drive sprocket 164 attached to the drive shaft 162. The drive sprocket 164 may alternatively be a gear, pulley or other type of device to operatively engage the particular type of drive member 170.

The embodiment of the drive member 170 shown in FIGS. 2 and 3 has a first belt 170a and a second belt 170b (best shown in FIG. 2). Referring to FIG. 3, the first belt 170a is engaged with the drive sprocket 164 and a first passive sprocket 172a mounted to a first passive shaft 174a attached the right leg 143a. The second belt 170b is coupled to a second passive sprocket 172b mounted to the first passive shaft 174a, and the second belt 170b is coupled to a third passive sprocket 172c mounted to a second passive shaft 174b attached to the left leg 143b. The second belt 170b accordingly extends along the fixed guide member 142, and an upper portion of the second belt 170b is fixedly attached to the first arm section 146. The first and second belts 170a and 170b may be similar to timing belts with transverse grooves 175 arranged along the back side of the belts to engage the sprockets 164 and 172a–172c. In alternative embodiments, the first and second belts 170a and 170b can also be regular belts without the transverse grooves, or they can be chains.

The drive mechanism 160 moves the arm 144 along the guide member 142 between a first position in which the clamp 150 is near the first side 128 of the processing station 120a, and a second position in which the clamp 150 is near the cassette 114 at the second side 129 of the processing station 120a. To move the clamp 150 along the processing path P₁ toward the cassette 114 with the drive mechanism 160 shown in FIGS. 2 and 3, the motor 161 rotates the drive sprocket 164 counter-clockwise (from the perspective of FIG. 2) to rotate the first passive shaft 174a counter-clockwise via the first belt 170a and the first passive sprocket 172a. The counter-clockwise rotation of the first passive shaft 174a rotates the second passive sprocket 172b counter-clockwise to move the upper portion of the second belt 170b toward the cassette 114. The second belt 170b accordingly pulls the first arm section 146 along the guide member 142 toward the cassette 114 to position the clamp 150 in the second position proximate to the cassette 114. The clamp 150 then engages a selected wafer frame 115 in the cassette 114. After the clamp 150 securely grips the selected wafer frame 115, the servo motor 161 rotates the drive sprocket 164 in the clockwise direction to move the first arm section 146 along the guide member 142 away from the cassette 144 until the clamp 150 is in the first position proximate to the first side 128 of the processing station 120a.

After the handling apparatus positions the substrate assembly 117 at the first processing station 120a, the expander machine 110 shrinks the thin backing film 116. The backing film 116 accordingly contracts to tighten the backing film 116 on the frame 115. The motor 161 then rotates the drive sprocket 164 counter-clockwise to move the clamp 150 into first position for replacing the substrate assembly into the cassette 114. The cassette is incrementally raised or lowered to position another substrate assembly 117 and frame 115 at the elevation of the clamp, and the process is repeated to tighten the backing film holding another substrate assembly 117.

Figure 4:
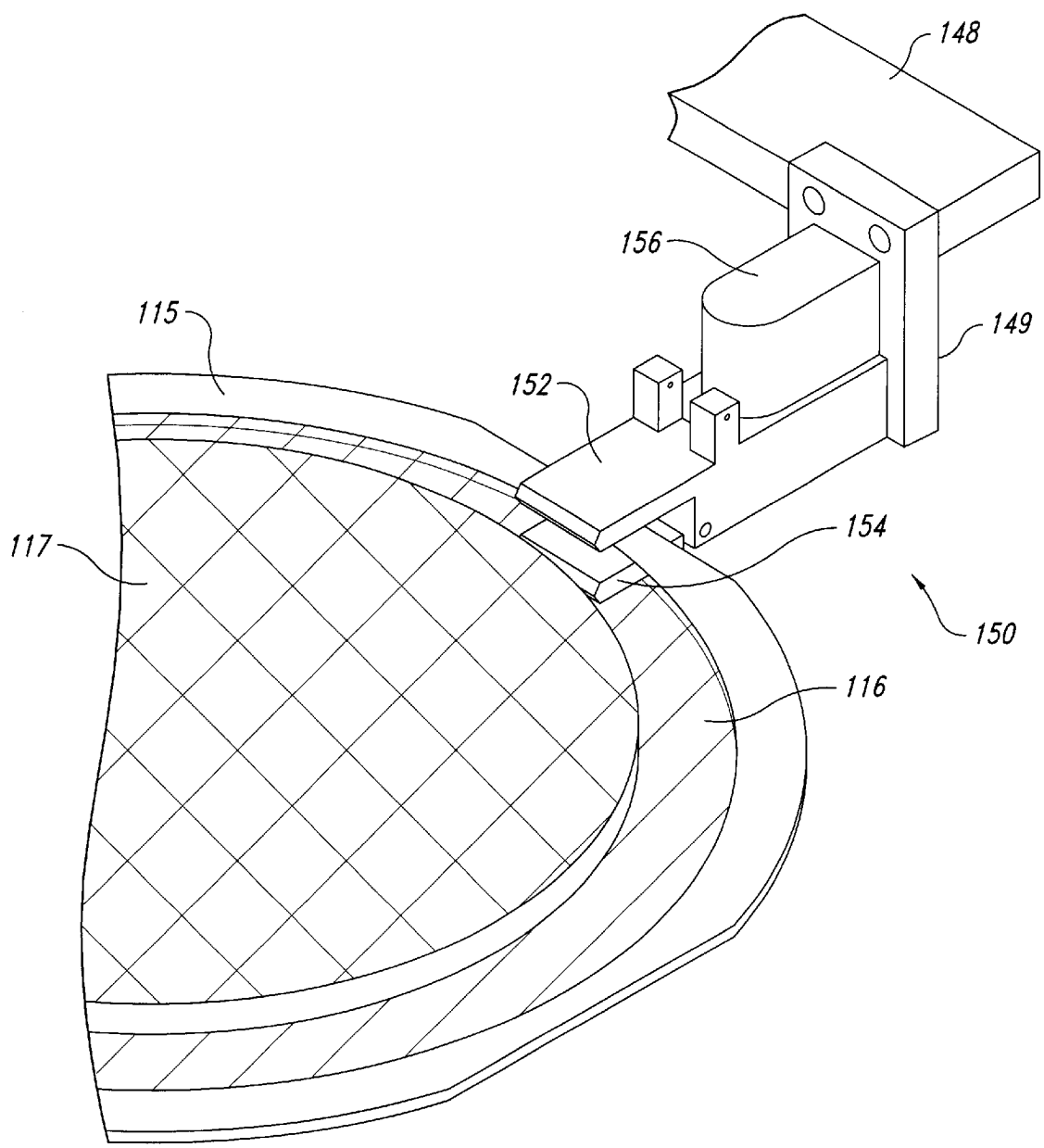
FIG. 4 is an isometric view of an embodiment of a clamp assembly for use with a handling system used in a method in accordance with the invention.

FIG. 4 is an isometric view illustrating one embodiment of the clamp 150 in greater detail. In this embodiment, the clamp 150 has a fixed upper jaw 152, a movable lower jaw 154, and an actuator 156 operatively coupled to the lower jaw 154. The actuator 156 is generally a pneumatic cylinder, but the actuator 156 can be a hydraulic cylinder, an electric motor or another type of actuator. The actuator 156 moves the lower jaw 154 with respect to the upper jaw 152 to positively clamp or disengage a selected frame 115. For example, when the clamp 150 is in the second position to remove a substrate 117 from the cassette 114 (FIG. 2), the actuator 156 moves the lower jaw 154 upward to clamp the frame 115 between the jaws 152 and 154. Conversely, to replace a substrate assembly 117 in the cassette 114, the actuator 156 moves the lower jaw 154 downward to disengage the frame 115. The clamp 150 accordingly provides positive engagement and disengagement of the frame 115 without relying on clips that wear out and may not provide sufficient friction against the frame 115.

Figure 5:
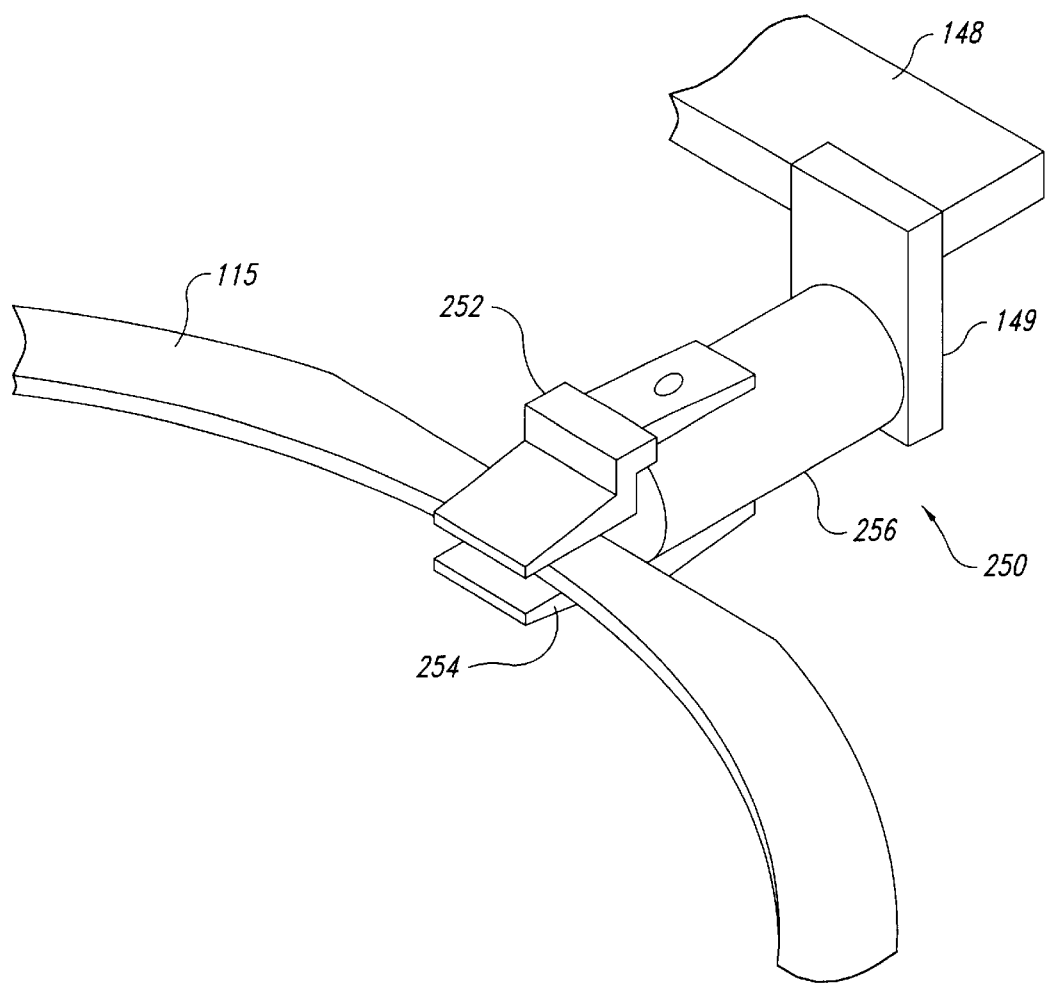
FIG. 5 is an isometric view of an embodiment of another clamp assembly for use with a handling system used in a method in accordance with the invention.

FIG. 5 is an isometric view illustrating another clamp 250 with movable upper and lower jaws 252 and 254. In this embodiment, an actuator 256 is coupled to both the upper and lower jaws 252 and 254. The actuator 256 moves the jaws 252 and 254 toward or away from one another for engaging or disengaging a frame 115, respectively, to operate in a similar manner as the clamp 150. The actuator 256 may also be a pneumatic cylinder, a hydraulic actuator, an electric motor or any type of suitable actuation device.

The substrate handling apparatus 130 illustrated in FIGS. 2 and 3 provides a durable system to avoid down-time for the expander machine 110. One aspect of the substrate handling apparatus 130 that makes it durable is that the guide assembly 140 is generally made from rigid, sturdy components that can withstand the forces and the friction that occur when handling substrate assemblies over a period of time. Additionally, the drive member 170 is also a sturdy component, such as a timing belt or chain, that can also withstand the forces of moving a substrate assembly between the cassette 114 and the processing station 120. Thus, compared to existing loaders that support a clamp with a thin-tape, the substrate handling apparatus 130 is expected to reduce the down-time for repairing and maintaining expander machines and other processing machines.

Figure 1:
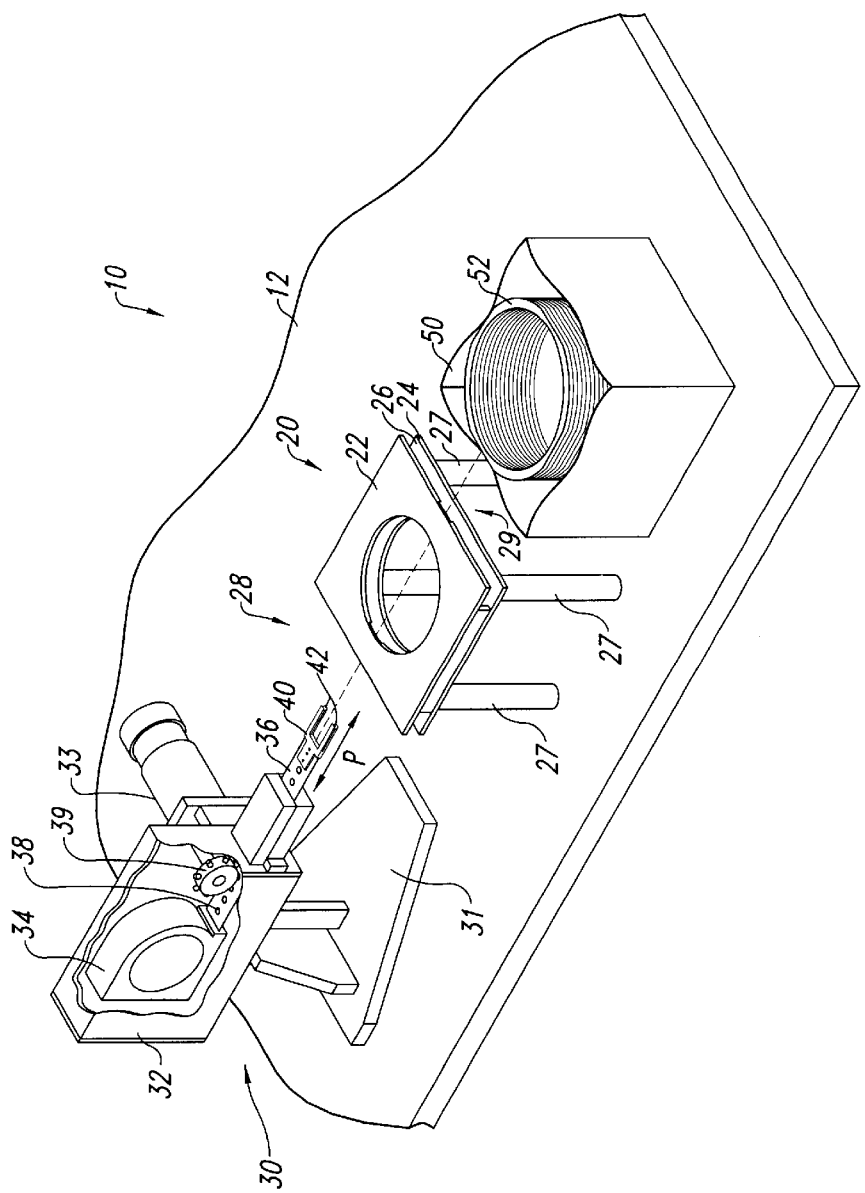
FIG. 1 is an isometric view of an existing expander machine with a loader in accordance with the prior art.

The wafer expander machine 110 is also expected to alleviate the problems of "shooting the gap" experienced by the conventional expander machine 10 described in FIG. 1. The guide assembly 140, for example, has rigid components that do not bend and cause vertical displacement of the clamp 150 along the length of the processing path P₁. Moreover, the arm 144 translates along the guide member 142 to move at a constant elevation in a direction at least substantially parallel to the processing path P₁. The substrate handling apparatus 130 accordingly consistently moves the arm 144 and the clamp 150 along the processing path. The slots 125 and 127 in the first plate 122 of the first processing station 120a also receive the clamp holder 149 and the clamp 150 at the level of the processing path P₁. The first plate 122 accordingly accommodates the clamp 150 so that the clamp holder 149 and the clamp 150 can move through the plate gap 126 without the possibility of hitting the first plate 122. Thus, the controlled motion of the substrate handling apparatus 130 and the slots 125 and 127 in the first plate 122 of the processing station 120a operate together to alleviate the problem of "shooting the gap" experienced with the conventional expanding machines 10 shown in FIG. 1.

The clamps 150 and 250 illustrated in FIGS. 4 and 5 also provide positive engagement and disengagement of the frames 115 to accurately load and unload the frames 115 from the cassette 114. Existing clamps in existing loaders have spring-type clips that may not provide sufficient friction to grip the frames because the clips may wear over time. The clamps 150 and 250 illustrated in FIGS. 4 and 5 overcome this problem by using an actuator to selectively move the jaws between an engaged position and a disengaged position. Therefore, the expander machine 110 is expected to provide better engagement and disengagement of the wafer frames 115 compared to existing expander machines.

Figure 6:
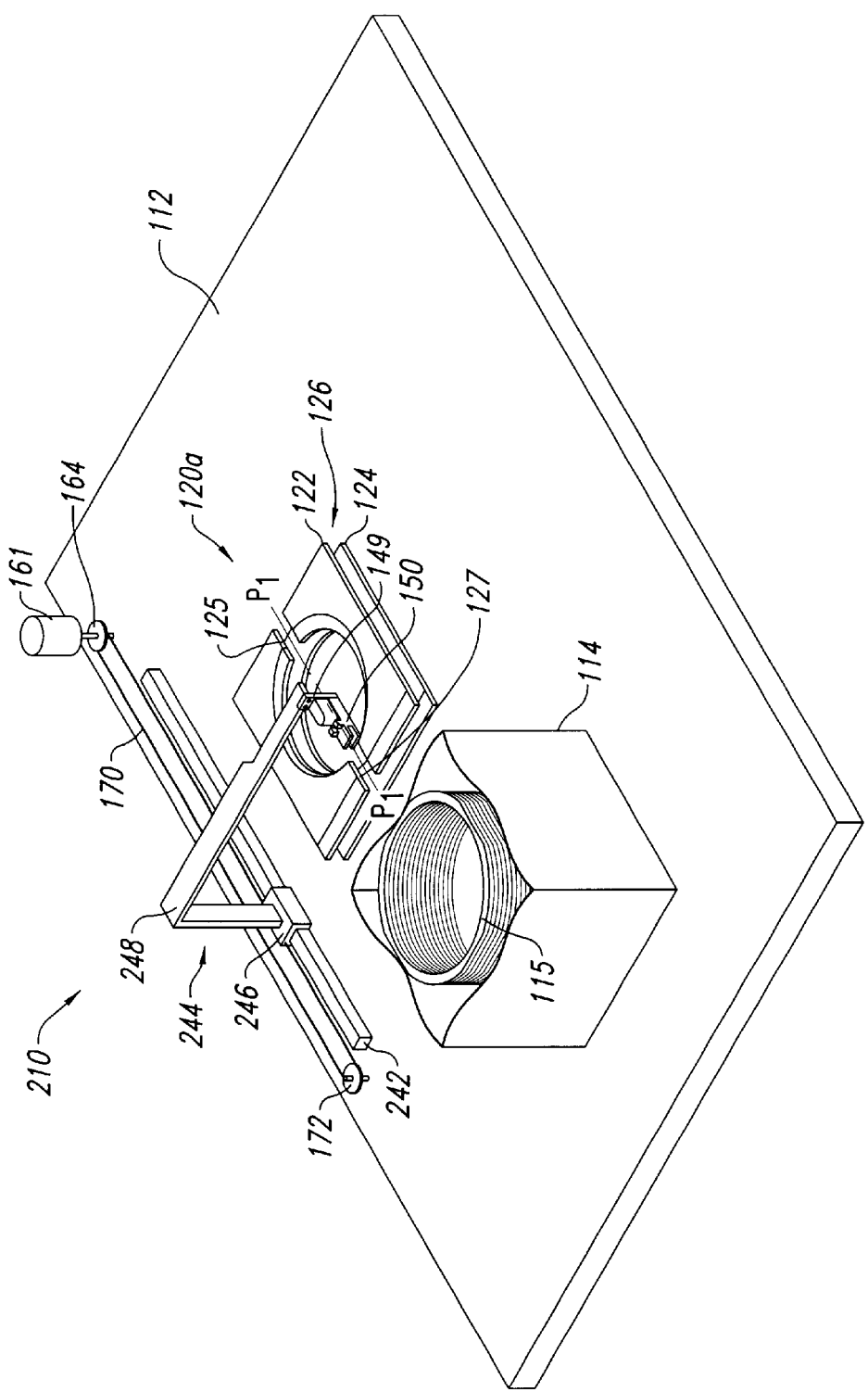
FIG. 6 is an isometric view of another embodiment of a handling assembly used in a method in accordance with another embodiment of the invention.

FIG. 6 is an isometric view illustrating an expander machine 210 in accordance with another embodiment of the invention. The expander machine 210 has a cassette 114 and a processing station 120a similar to those described above with respect to the expander machine 110. The expander machine 210, however, has a different guide assembly with a guide member 242 that is a rail attached directly to the table 112. Additionally, the guide assembly has an arm 244 with a first section 246 slidably attached to the guide member 242 and a second arm section 248 projecting upward from the first section 246 and transverse to the processing path P₁ to locate the clamp 150 along the processing path P₁. The second arm section 248, for example, can be an L-shaped bar to position the clamp 150 at the processing path P₁. The expander machine 210 also has a motor 161 mounted vertically to the table 112 such that the drive member 170 wraps around the drive sprocket 164 and a passive sprocket 172. The drive member 170 can be a belt or chain, as described above. The drive member 170 is also fixedly attached to the first section 246 of the arm 244. Accordingly, the motor 161 rotates the drive sprocket 164 to move the drive member 170 and slide the aim 244 along the guide member 242.

Figure 7:
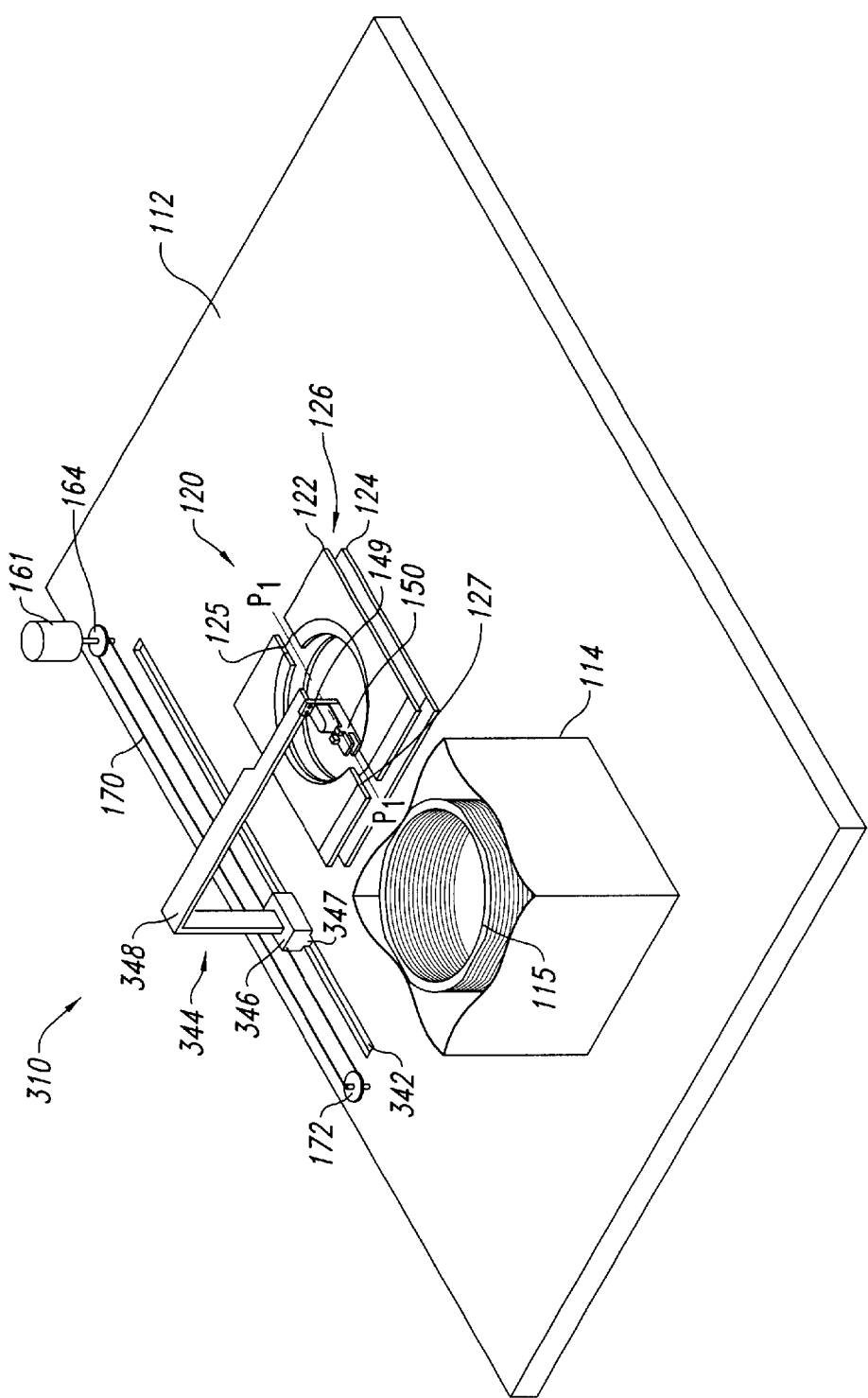
FIG. 7 is an isometric view of yet another embodiment of a handling system used in a method in accordance with yet another embodiment of the invention.

FIG. 7 is an isometric view illustrating an expander machine 310 in accordance with another embodiment of the invention. In this embodiment, the expander machine 310 has a guide assembly with a guide member 342 that is an elongated slot or channel in the table 112. The guide assembly also has an arm 344 with a first arm section 346 having a key 347 positioned in the guide member 342, and an L-shaped second arm section 348 attached to the first arm section 346. The motor 161 and the guide member 170 are the same as those described above with reference to the expander machine 210 shown in FIG. 6.

Figure 8:
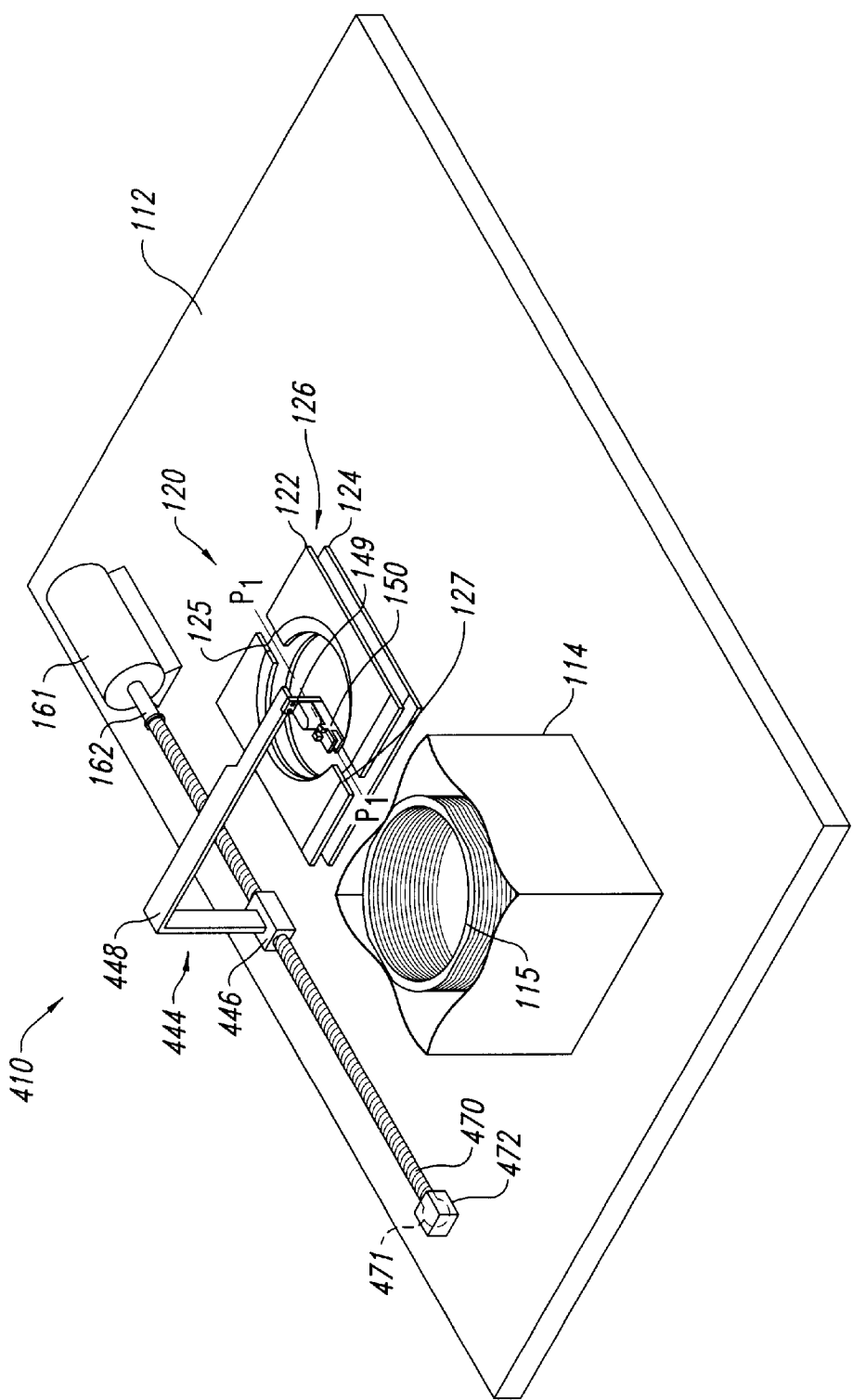
FIG. 8 is an isometric view of still another embodiment of a handling system used in a method in accordance with still another embodiment of the invention.

FIG. 8 is an isometric view illustrating an expander machine 410 in accordance with yet another embodiment of the invention. In this embodiment, the drive mechanism has a motor 161 with a drive shaft 162, and a threaded drive member 470 coupled to the drive shaft 162. The drive member 470 is preferably a ball screw with a freely rotating ball 471 received in a block 472 attached to the table 112. The expander machine 410 also has an arm 444 with a first arm section 446 threadedly coupled to the drive member 470 and an L-shaped second arm member 448 projecting from the first arm member 446. The motor 161 rotates the drive member 470 to translate the first arm section 446 along the drive member 470. The drive member 470 accordingly also acts as a guide member for the aim 444. The expander machine 410, therefore, combines the guide member and the drive member into a single component that both guides and drives the aim 444 along the processing path $P_1$.

From the foregoing it will be appreciated that, although specific embodiments of the invention have been described herein for purposes of illustration, various modifications may be made without deviating from the spirit and scope of the invention. For example, the substrate handling apparatuses are described above with reference to expander machines, but the substrate handling apparatuses can also be used in other processing machines used in the fabrication or packaging of microelectronic devices. Accordingly, the invention is not limited except as by the appended claims.

What is claimed is:

1. A method for handling a wafer assembly having a frame, a backing film attached to the frame, and a microelectronic-substrate assembly attached to the backing film, the method comprising;

moving a clamp of a substrate handling apparatus at an elevation along a processing path through a processing station of a processing machine by sliding an arm attached to the clamp along a guide member having an elongated shape corresponding to the processing path, the clamp being selectively moved between a first position at a first side of the processing station to hold a substrate assembly at the processing station and a second position at a second side of the processing station to grip or release a selected frame and substrate assembly in a cassette, wherein the guide member comprises an elongated beam fixedly attached to first and second legs projecting from a table of the processing machine, the beam having a length defining a longitudinal axis and the beam being spaced apart from the processing path, the arm comprises a first arm section having a bracket slidably attached to the beam to slide along the longitudinal axis and a second arm section having a bar attached to the bracket and extending transversely from the bracket, and wherein moving the clamp comprises sliding the bracket along the beam; and operating the clamp in the second position by either gripping the selected frame to carry the substrate assembly from the second position to the first position at the processing station, or releasing the selected frame to place the selected frame and substrate assembly back in the cassette.

2. A method for handling a wafer assembly having a frame, a backing film attached to the frame, and a microelectronic-substrate assembly attached to the backing film, the method comprising;

moving a clamp of a substrate handling apparatus at an elevation along a processing path through a processing station of a processing machine by sliding an arm attached to the clamp along a guide member having an elongated shape corresponding to the processing path, the clamp being selectively moved between a first position at a first side of the processing station to hold a substrate assembly at the processing station and a second position at a second side of the processing station to grip or release a selected frame and substrate assembly in a cassette, wherein the guide member comprises an elongated rail fixedly attached to a table of the processing machine, the rail having a length defining a longitudinal axis and the rail being spaced apart from the processing path, and the arm comprises a first arm section having a block with a slot receiving the rail to slidably attach the block to the rail and a second arm section having a bar attached to the block and extending transversely from the block, and wherein moving the clamp comprises sliding the block along the rail; and operating the clamp in the second position by either gripping the selected frame to carry the substrate assembly from the second position to the first position at the processing station, or releasing the selected frame to place the selected frame and substrate assembly back in the cassette.

3. A method for handling a wafer assembly having a frame, a backing film attached to the frame, and a microelectronic-substrate assembly attached to the backing film, the method comprising;

moving a clamp of a substrate handling apparatus at an elevation along a processing path through a processing station of a processing machine by sliding an arm attached to the clamp along a guide member having an elongated shape corresponding to the processing path, the clamp being selectively moved between a first position at a first side of the processing station to hold a substrate assembly at the processing station and a second position at a second side of the processing station to grip or release a selected frame and substrate assembly in a cassette, wherein the guide member comprises an elongated channel in a table of the processing machine, the channel having a length defining a longitudinal axis and the channel being spaced apart from the processing path, and the arm comprises a first arm section having a block with a key received the channel to slidably attach the block to the table to slide along the channel and a second arm section having a bar attached to the block, the bar extending upward from the block and transversely with respect to the processing path to position the clamp at the processing path, and wherein moving the clamp comprises sliding the block along the channel; and operating the clamp in the second position by either gripping the selected frame to carry the substrate assembly from the second position to the first position at the processing station, or releasing the selected frame to place the selected frame and substrate assembly back in the cassette.

4. A method for handling a wafer assembly having a frame, a backing film attached to the frame, and a microelectronic-substrate assembly attached to the backing film, the method comprising;

moving a clamp of a substrate handling apparatus at an elevation along a processing path through a processing station of a processing machine by sliding an arm attached to the clamp along a guide member having an elongated shape corresponding to the processing path, the clamp being selectively moved between a first position at a first side of the processing station to hold a substrate assembly at the processing station and a second position at a second side of the processing station to grip or release a selected frame and substrate assembly in a cassette, wherein the processing machine further comprises a servo motor with a drive shaft and a threaded drive member attached to the drive shaft of the servo motor, the drive member being attached to a table of a processing machine and the drive member extending along the table at least substantially parallel to the processing path to also define a guide member, and the arm comprises a first arm section having block with a threaded hole receiving the threaded drive member and a second arm section having a bar attached to the block, the bar extending upward from the block and transversely with respect to the processing path to position the clamp at the processing path, and wherein moving the clamp comprises rotating the drive shaft and the threaded drive member to slide the block along the dreaded drive member; and operating the clamp in the second position by either gripping the selected frame to carry the substrate assembly from the second position to the first position at the processing station, or releasing the selected frame to place the selected frame and substrate assembly back in the cassette.

5. A method of handling a wafer assembly having a frame, a backing film attached to the frame, and a microelectronic-device substrate assembly attached to the backing film, the method comprising;

translating an arm along a guide member having an elongated shape extending along a processing machine at least substantially parallel to a processing path running from a first side of a processing station to a second side of the processing station proximate to a cassette of substrate assemblies coupled to frames, wherein the guide member comprises an elongated beam fixedly attached to first and second legs projecting from a table of the processing machine, the beam having a length defining a longitudinal axis and the beam being spaced apart from the processing path, the arm comprises a first arm section having a bracket slidably attached to the beam to slide along the longitudinal axis and a second arm section having a bar attached to the bracket and extending transversely from the bracket, and wherein translating the arm along the guide member comprises sliding the bracket along the beam; and positioning at least a portion of the arm over the processing path as the arm translates along the guide member; and selectively closing a clamp to grip a selected frame and substrate assembly to carry the selected substrate assembly from a wafer cassette to the processing station, and selectively opening the clamp to release the selected frame and substrate assembly to place the selected substrate assembly back in the cassette.

6. A method of handling a wafer assembly having a frame, a backing film attached to the frame, and a microelectronic-device substrate assembly attached to the backing film, the method comprising;

translating an arm along a guide member having an elongated shape extending along a processing machine at least substantially parallel to a processing path running from a first side of a processing station to a second side of the processing station proximate to a cassette of substrate assemblies coupled to frames, wherein the guide member comprises an elongated rail fixedly attached to a table of the processing machine, the rail having a length defining a longitudinal axis and the rail being spaced apart from the processing path, and the arm comprises a first arm section having a block with a slot receiving the rail to slidably attach the block to the rail and a second arm section having a bar attached to the block and extending transversely from the block, and wherein translating the arm along the guide member comprises sliding the block along the rail; and positioning at least a portion of the arm over the processing path as the arm translates along the guide member; and selectively closing a clamp to grip a selected frame and substrate assembly to carry the selected substrate assembly from a wafer cassette to the processing station, and selectively opening the clamp to release the selected frame and substrate assembly to place the selected substrate assembly back in the cassette.

7. A method of handling a wafer assembly having a frame, a backing film attached to the frame, and a microelectronic-device substrate assembly attached to the backing film, the method comprising;

translating an arm along a guide member having an elongated shape extending along a processing machine at least substantially parallel to a processing path running from a first side of a processing station to a second side of the processing station proximate to a cassette of substrate assemblies coupled to frames, wherein the guide member comprises an elongated channel in a table of the processing machine, the channel having a length defining a longitudinal axis and the channel being spaced apart from the processing path, and the arm comprises a first arm section having a block with a key received the channel to slidably attach the block to the table to slide along the channel and a second arm section having a bar attached to the block, the bar extending upward from the block and transversely with respect to the processing path to position the clamp at the processing path, and wherein translating the arm along the guide member comprises sliding the block along the channel; and positioning at least a portion of the arm over the processing path as the arm translates along the guide member; and selectively closing a clamp to grip a selected frame and substrate assembly to carry the selected substrate assembly from a wafer cassette to the processing station, and selectively opening the clamp to release the selected frame and substrate assembly to place the selected substrate assembly back in the cassette.

8. A method of handling a wafer assembly having a frame, a backing film attached to the frame, and a microelectronic-device substrate assembly attached to the backing film, the method comprising;

translating an arm along a guide member having an elongated shape extending along a processing machine at least substantially parallel to a processing path running from a first side of a processing station to a second side of the processing station proximate to a cassette of substrate assemblies coupled to frames, wherein the processing machine further comprises a servo motor with a drive shaft and a threaded drive member attached to the drive shaft of the servo motor, the drive member being attached to a table of a processing machine and the drive member extending along the table at least substantially parallel to the processing path to also define a guide member, and the arm comprises a first arm section having block with a threaded hole receiving the threaded drive member and a second arm section having a bar attached to the block, the bar extending upward from the block and transversely with respect to the processing path to position the clamp at the processing path, and wherein translating the arm along the guide member comprises rotating the drive shaft and the threaded member to slide the block along the threaded member; and positioning at least a portion of the arm over the processing path as the arm translates along the guide member; and selectively closing a clamp to grip a selected frame and substrate assembly to carry the selected substrate assembly from a wafer cassette to the processing station, and selectively opening the clamp to release the selected frame and substrate assembly to place the selected substrate assembly back in the cassette.

* * * * *